(12) United States Patent
Lee

(10) Patent No.: US 9,431,372 B2
(45) Date of Patent: Aug. 30, 2016

(54) MULTI-CHIP PACKAGE

(71) Applicant: SK hynix Inc., Gyeonggi-do (KR)

(72) Inventor: Dong-Beom Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/569,207

(22) Filed: Dec. 12, 2014

(65) Prior Publication Data

US 2016/0086919 A1    Mar. 24, 2016

(30) Foreign Application Priority Data

Sep. 24, 2014   (KR) .......................... 10-2014-0127409

(51) Int. Cl.
  *H01L 29/49*   (2006.01)
  *H01L 25/065*  (2006.01)
  *H01L 23/48*   (2006.01)

(52) U.S. Cl.
  CPC .......... *H01L 25/0657* (2013.01); *H01L 23/481* (2013.01)

(58) Field of Classification Search
  CPC .......... G11C 16/10; G11C 16/06; G11C 7/10; H01L 23/481; H01L 25/0657
  See application file for complete search history.

(56) References Cited

U.S. PATENT DOCUMENTS

| | | | |
|---|---|---|---|
| 2009/0039915 A1* | 2/2009 | Ruckerbauer | G11C 5/02 326/38 |
| 2010/0020583 A1* | 1/2010 | Kang | G11C 5/02 365/51 |
| 2012/0059984 A1* | 3/2012 | Kang | H01L 25/18 711/106 |
| 2012/0212990 A1* | 8/2012 | Park | G06F 13/20 365/63 |
| 2013/0021079 A1* | 1/2013 | Jeong | H03K 5/135 327/286 |
| 2013/0336039 A1* | 12/2013 | Frans | G11C 5/02 365/51 |
| 2014/0124953 A1* | 5/2014 | Jeon | H01L 25/0657 257/774 |
| 2014/0264730 A1* | 9/2014 | Haba | H01L 23/5256 257/529 |
| 2014/0374923 A1* | 12/2014 | Park | H01L 25/0657 257/777 |
| 2015/0213860 A1* | 7/2015 | Narui | G11C 7/22 365/51 |
| 2015/0302915 A1* | 10/2015 | Park | G11C 11/4096 365/189.05 |

FOREIGN PATENT DOCUMENTS

KR    1020130109791    10/2013

* cited by examiner

*Primary Examiner* — Michael Shingleton
(74) *Attorney, Agent, or Firm* — IP & T Group LLP

(57) ABSTRACT

A multi-chip package includes first and second semiconductor chips that are sequentially stacked, each of the first and second semiconductor chips including an operation block for an internal operation, third and fourth semiconductor chips that are sequentially stacked over the second semiconductor chip and rotated 180 degrees in a horizontal direction with respect to the first and second semiconductor chips, each of the third and fourth semiconductor chips including an operation block, and through chip vias for transmitting predetermined signals between the operation blocks of the first to fourth semiconductor chips.

14 Claims, 4 Drawing Sheets

# MULTI-CHIP PACKAGE

CROSS-REFERENCE TO RELATED APPLICATIONS

The present application claims priority of Korean Patent Application No. 10-2014-0127409, filed on Sep. 24, 2014, which is incorporated herein by reference in its entirety.

BACKGROUND

1. Field

Various embodiments of the present invention relate to a semiconductor design technology, and more particularly, to a multi-chip package.

2. Description of the Related Art

The demand for high performance and miniaturization of electronic products has led to the development of various technologies for stacked packages. The term 'stack' in the semiconductor industry means piling up two or more semiconductor chips or packages vertically. For example, semiconductor memory device stacked packages may have two or more times the memory capacity as those realized through traditional semiconductor integration processes. In addition, since the stacked package has advantages in terms of packaging density, packaging efficiency, packaging area, as well as increased memory capacity, research and development on stacked packages continues to accelerate.

Stacked packages may be seen as the result of the practical application of three-dimensional (3D) structure technology, in which a plurality of memory chips are stacked to improve integration density. Due to the demand for highly integrated, high performance, high capacity semiconductor devices, multi-channel semiconductor memory devices have been developed in a stacked package form.

Since multi-channel semiconductor memory devices have a plurality of stacked memory chips (or channel memories), a through chip via (e.g., a through silicon via) may be used for conductive lines between the memory chips. When a multiple channels are formed by stacking the memory chips, each of the memory chips may include a data transmission/reception circuit to transmit/receive data, wherein each memory chip has its own channel. In other words, one data transmission/reception circuit is required for each of the memory chips to transmit/receive data. However, when a plurality of memory chips are designed to include a single data transmission/reception circuit for each channel, it is not efficient because they have to be designed differently from each other. Thus, the memory chips must have a plurality of data transmission/reception circuits for each channel. For example, when four channels and four memory chips are included, each of the memory chips may include four data transmission/reception circuits. For this reason, a number of transmission/reception circuits may be unnecessarily coupled with a single transmission line. FIG. 1 shows the concerns described above.

FIG. 1 is a block diagram illustrating a conventional multi-chip package.

Referring to FIG. 1, the conventional multi-chip package may include a single master chip 110 and a plurality of slave chips 120, 130, 140 and 150.

The multi-chip package includes four channels. The master chip 110 includes four data transmission/reception circuits corresponding to the four channels to transmit data to a plurality of slave chips. Each of the slave chips 120, 130, 140 and 150 includes four data transmission/reception circuits. Although each of the slave chips 120, 130, 140 and 150 includes four data transmission/reception circuits, only one data transmission/reception circuit is to be enabled and used for each slave chip under actual conditions. Each of the slave chips 120, 130, 140 and 150 may select and use one transmission/reception circuit among the four data transmission/reception circuits based on a slice (or chip) identification (ID, not shown). In other words, although each of the slave chips 120, 130, 140 and 150 includes four data transmission/reception circuits, and the total number of the data transmission/reception circuits is 16, four data transmission/reception circuits are to be used under actual conditions. Therefore, the amount of circuit area unnecessarily occupied by the data transmission/reception circuits increases, and the amount of power consumption also increases. In addition, the loading of signal lines for transmitting data, which are coupled with each other by through-silicon-vias (TSVs) may be increased. The loading of signal lines may cause delays in transmitting data or voltage drops in the internal voltage supply.

SUMMARY

Various embodiments of the present invention are directed to a multi-chip package including a plurality of semiconductor chips stacked on one another, which may control data transmission/reception in multiple-channels.

In accordance with an embodiment of the present invention, a multi-chip package may include: first and second semiconductor chips that are sequentially stacked, each of the first and second semiconductor chips including an operation block for an internal operation; third and fourth semiconductor chips that are sequentially stacked over the second semiconductor chip and rotated 180 degrees in a horizontal direction with respect to the first and second semiconductor chips, each of the third and fourth semiconductor chips including an operation block; and through chip vias for transmitting predetermined signals between the operation blocks of the first to fourth semiconductor chips.

The operation blocks may include in the first and second semiconductor chips are disposed on one side, and the operation blocks included in the third and fourth semiconductor chips are disposed on the other side.

Each of the operation blocks may include a data transmission/reception circuit suitable for transmitting/receiving data.

Each of the operation blocks may include an internal voltage generation block suitable for generating an internal voltage.

In accordance with an embodiment of the present invention, a multi-chip package may include: a master chip including transmission/reception circuits suitable for transmitting/receiving data; a first slave region that includes a data transmission/reception block suitable for transmitting/receiving data to/from the master chip and is stacked over the master chip; and a second slave region that includes the data transmission/reception block and is stacked over the first slave region and rotated 180 degrees in a horizontal direction with respect to the first slave region. The data transmission/reception block of the first slave region is disposed on one side, and the data transmission/reception block of the second slave region is disposed on the other side.

The first slave region may include a first slave chip stacked over the master chip; and a second slave chip stacked over the first slave chip.

The second slave region may include a third slave chip stacked over the second slave chip; and a fourth slave chip stacked over the third slave chip.

Each of the first to fourth slave chips may include: first and second data transmission/reception blocks suitable for transmitting/receiving data to/from the master chip; and a control signal generation block suitable for controlling enabling of the first and second data transmission/reception blocks based on a power source received from the master chip.

The control signal generation block may generate a first control signal for enabling of the first data transmission/reception block; and a second control signal for enabling of the second data transmission/reception block.

The first and second control signals may have complementary logic levels.

The control signal generation block may control the first and second data transmission/reception blocks to be selectively enabled.

The multi-chip package may further include through chip vias for transmitting/receiving the data between the master chip and the first to fourth slave chips.

The first and second control signals may have a value corresponding to a chip identification of a selected slave chip among the slave chips.

In accordance with another embodiment of the present invention, a multi-chip package may include: a master chip; a plurality of slave chips stacked over the master chip; and through chip vias for transmitting a predetermined signal between the master chip and the slave chips, wherein each of the slave chips may include a signal transmission circuit block for exchanging the predetermined signal with the master chip through one of the through chip vias, and wherein the signal transmission circuit blocks corresponding to the same through chip via may be disposed to overlap with each other, and the signal transmission circuit blocks corresponding to different through chip vias are disposed without overlapping each other.

Each of the slave chips may further include a control signal generation block suitable for controlling the corresponding signal transmission circuit block.

The signal transmission circuit block may include signal transmission circuits corresponding to the through chip vias, and the control signal generation block may generate control signals corresponding to the number of the signal transmission circuits.

The signal transmission circuits may be selectively enabled based on the control signals.

The control signals may have a value corresponding to a chip identification of a selected slave chip among the slave chips.

In accordance with an embodiment of the present invention, a multi-chip package may include: first to fourth semiconductor chips that are sequentially stacked, each of the first to fourth semiconductor chips including an internal voltage generation block suitable for generating an internal voltage; and through chip vias suitable for supplying the internal voltage between the first to fourth semiconductor chips. The internal voltage generation blocks included in the first and second semiconductor chips are disposed on one side, and the third and fourth semiconductor chips are stacked to be symmetrical to the first and second semiconductor chips, and the internal voltage generation blocks included in the third and fourth semiconductor chips are disposed on the other side.

DETAILED DESCRIPTION

Figure 1:
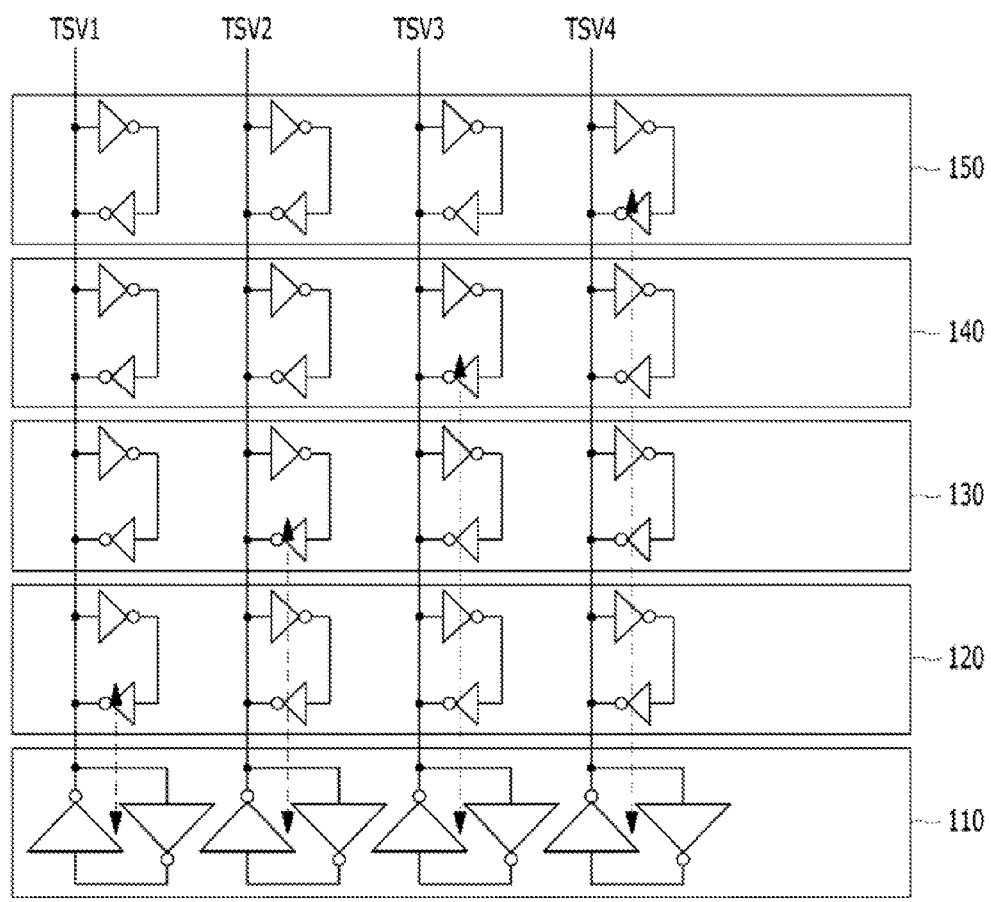
FIG. 1 is a block diagram illustrating a conventional multi-chip package.

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also where a third layer exists between the first layer and the second layer or the substrate.

Figure 2:
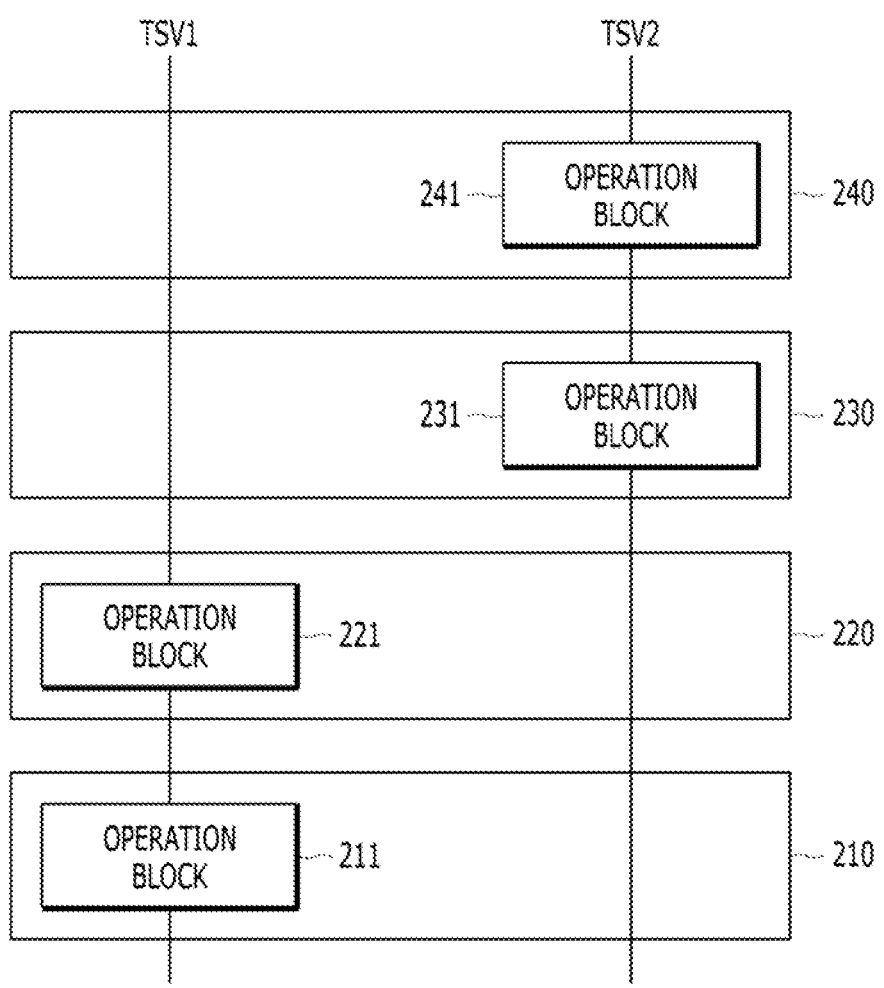
FIG. 2 is a block diagram illustrating a multi-chip package in accordance with an embodiment of the present invention.

FIG. 2 is a block diagram illustrating a multi-chip package in accordance with an embodiment of the present invention.

Referring to FIG. 2, the multi-chip package may include a plurality of semiconductor chips 210, 220, 230 and 240 that are stacked on one another. The semiconductor chips 210, 220, 230 and 240 may include operation blocks 211, 221, 231 and 241 for performing internal operations, respectively. The operation blocks 211, 221, 231 and 241 may be data transmission/reception circuits for transmitting/receiving data or internal voltage generation circuits for generating an internal voltage. A detailed description thereon is provided below with reference to FIGS. 3 and 5.

When the semiconductor chips 210, 220, 230 and 240 are stacked on one another, the third and fourth semiconductor chips 230 and 240 among the semiconductor chips 210, 220, 230 and 240 may be stacked to be rotated 180 degrees in a horizontal direction relative to the first and second semiconductor chips 210 and 220. In other words, when the first to fourth semiconductor chips 210, 220, 230 and 240 are stacked on one another, the operation blocks 211 and 221 included in the first and second semiconductor chips 210 and 220 and the operation blocks 231 and 241 included in the third and fourth semiconductor chips 230 and 240 may be stacked to be disposed on one side and the other side without overlapping with each other.

The stacking of the semiconductor chips 210, 220, 230 and 240 may reduce the loading (or delay) of signal lines, which occurs when operations such as data transmission/reception or internal voltage supply is performed in multiple channels.

The semiconductor chips 210, 220, 230 and 240 may be coupled with a first through silicon via TSV1 and a second through silicon via TSV2 for transmitting data or for supplying internal voltages. Here, the first and second through silicon vias TSV1 and TSV2 may be replaced with another type of through chip via.

Figure 3:
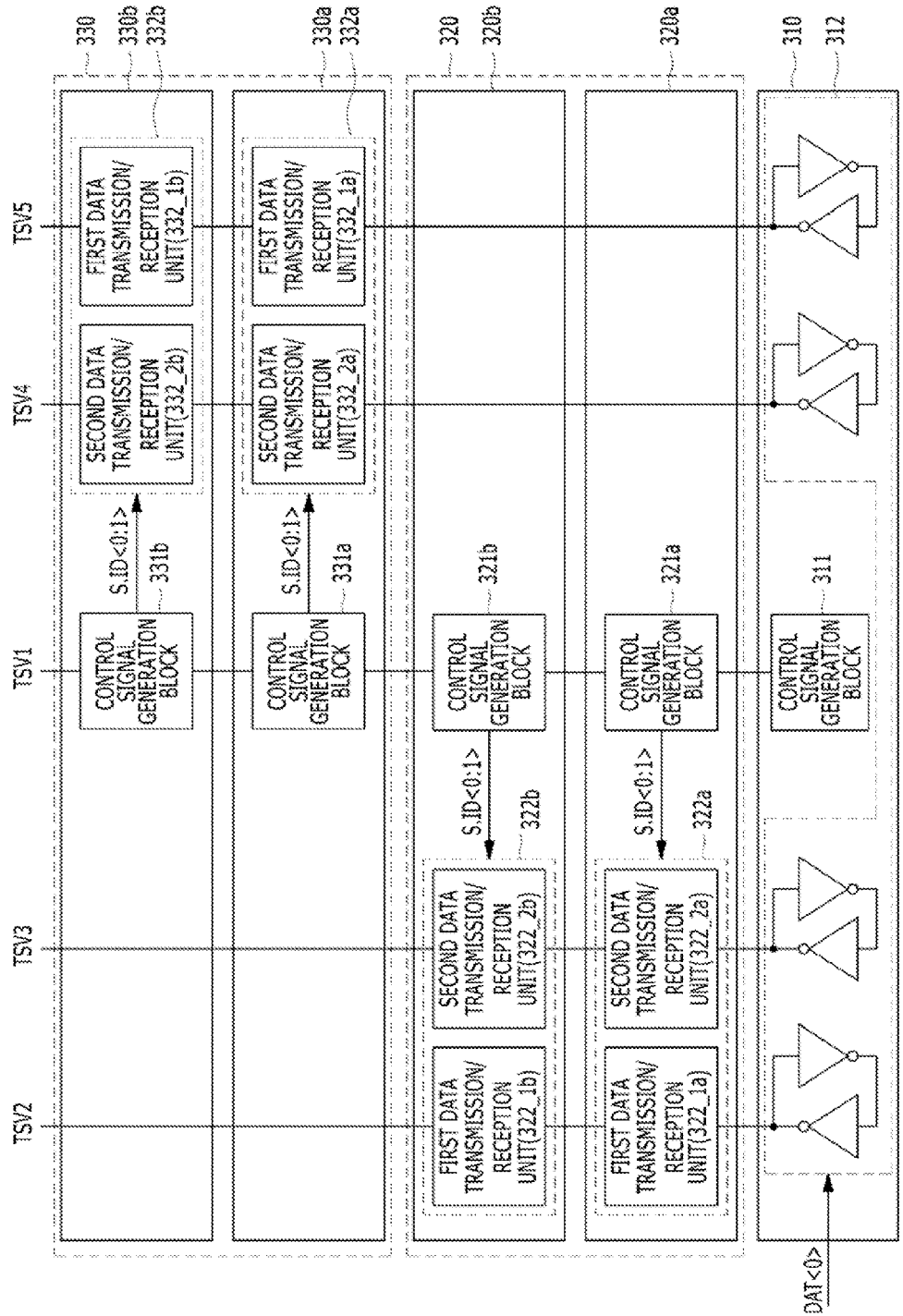
FIG. 3 is a block diagram illustrating a multi-chip package in accordance with an embodiment of the present invention.

FIG. 3 is a block diagram illustrating a multi-chip package in accordance with an embodiment of the present invention.

Referring to FIG. 3, the multi-chip package may include a master chip 310, a first slave region (or first slave chips) 320, and a second slave region (or second slave chips) 330.

The multi-chip package may be formed of multiple-channels, and the master chip 310, the first slave region 320, and the second slave region 330 are coupled with first to fifth through silicon vias TSV1, TSV2, TSV3, TSV4 and TSV5. Here, the first to fifth through silicon vias TSV1, TSV2, TSV3, TSV4 and TSV5 may be replaced with another type of through chip via.

The first through silicon via TSV1 among the first to fifth through silicon vias TSV1, TSV2, TSV3, TSV4 and TSV5 may transmit a ground source VSS to the first slave region 320 and the second slave region 330. The second to fifth through silicon vias TSV2, TSV3, TSV4 and TSV5 may transmit the same data, e.g., a first data DAT<0>, to the first slave region 320 and the second slave region 330. Each of the second to fifth through silicon vias TSV2, TSV3, TSV4 and TSV5 may be included in the first to fourth channels.

The master chip 310 may include a power source supply block 311 and a plurality of data transmission/reception circuits 312.

The power source supply block 311 may supply the ground source VSS to the first slave region 320 and the second slave region 330, which are to be described below. The power source supply block 311 may transmit the ground source VSS supplied from an external device to the first slave region 320 and the second slave region 330 based on internal control. For example, the power source supply block 311 may transmit the ground source VSS to the first slave region 320 and the second slave region 330 by using a switch (not shown) in a predetermined mode.

Each of the data transmission/reception circuits 312 may transmit data to the first slave region 320 and the second slave region 330 or receive the data from the first slave region 320 and the second slave region 330. The data transmission/reception circuits 312 may include 3 state inverters that operate as transmitters or receivers.

The first slave region 320 may be stacked over the master chip 310 and include a first slave chip 320a and a second slave chip 320b. The second slave region 330 may be stacked over the first slave region 320 and include a third slave chip 330a and a fourth slave chip 330b. The third and fourth slave chips 330a and 330b may be symmetrical. In other words, the third and fourth slave chips 330a and 330b may be rotated 180 degrees with respect to the first and second slave chips 320a and 320b and stacked.

The first to fourth slave chips 320a, 320b, 330a and 330b may include control signal generation blocks 321a, 321b, 331a and 331b and data transmission/reception blocks 322a, 322b, 332a and 332b, respectively. The control signal generation blocks 321a, 321b, 331a and 331b included in the first to fourth slave chips 320a, 320b, 330a and 330b, respectively, may be disposed in the middle of the corresponding slave chips. The data transmission/reception blocks 322a and 322b of the first and second slave chips 320a and 320b may be disposed on one side of the control signal generation blocks 321a and 321b, and the data transmission/reception blocks 332a and 332b of the third and fourth slave chips 330a and 330b may be disposed on the other side of the control signal generation blocks 331a and 331b. In other words, since the first and second slave chips 320a and 320b and the third and fourth slave chips 330a and 330b are stacked and rotated 180 degrees with respected to each other, the data transmission/reception blocks 322a and 322b included in the first and second slave chips 320a and 320b and the data transmission/reception blocks 332a and 332b included in the third and fourth slave chips 330a and 330b may be disposed in the opposite direction.

The control signal generation block 321a of the first slave chip 320a may generate a control signal S.ID<0:1> for controlling the data transmission/reception block 322a of the first slave chip 320a based on the ground source VSS supplied from the power source supply block 311 in the master chip 310 through the first through silicon via TSV1. The value of the first control signal S.ID<0> corresponds to a slice ID (or a chip ID) of a selected slave chip. Also, the control signal generation block 321a may convert a level of the ground source VSS through an inverter (not shown) and transmit the converted level of the ground source VSS to a neighboring slave chip, e.g., the second slave chip 320b, through the first through silicon via TSV1. For example, the control signal generation block 321a of the first slave chip 320a receives the ground source VSS having a logic low level from the power source supply block 311 of the master chip 310 and generates the value of '10' which is the 2-bit control signals S.ID<0:1> having complementary values to each other based on the ground source VSS and transmits a signal of a logic high value to the control signal generation block 321b of the second slave chip 320b through the first through silicon via TSV1 by converting the level of the ground source VSS. Thus, the control signal generation blocks 321b, 331a and 331b of the second to fourth slave chips 320b, 330a and 330b may generate control signals S.ID<0:1> having a value of '01', control signals S.ID<0:1> having a value of '10' and control signals S.ID<0:1> having a value of '01', respectively.

The data transmission/reception blocks 322a, 322b, 332a and 332b of the first to fourth slave chips 320a, 320b, 330a and 330b may include first data transmission/reception units 322_1a, 322_1b, 332_1a and 332_1b and second data transmission/reception units 322_2a, 322_2b, 332_2a and 332_2b, respectively. An enabling operation of the first data transmission/reception unit 322_1a of the first slave chip 320a among the first data transmission/reception units 322_1a, 322_1b, 332_1a and 332_1b of the first to fourth slave chips 320a, 320b, 330a and 330b may be controlled based on the value of the first control signal S.ID<0>, and an enabling operation of the second data transmission/reception unit 322_2a may be controlled based on the value of the second control signal S.ID<1>. Thus, the first data transmission/reception unit 322_1a and the second data transmission/reception unit 322_2a may not be simultaneously to enabled, and one of them may be selectively enabled and receive data from the master chip 310 or transmit data to the master chip 310. Since the control signals S.ID<0:1> have complementary values in a neighboring slave chip, e.g., the second slave chip 320b, the data transmission/reception blocks selected from the first slave chip 320a and the second slave chip 320b may be different. For example, when the first data transmission/reception unit 322_1a is enabled based on the first control signal S.ID<0> in the first slave chip 320a, the second data transmission/reception unit 322_2b may be selectively enabled based on the second control signal S.ID<1> in the second slave chip 320b, and the first data transmission/reception unit 332_2a may be selectively enabled based on the first control signal S.ID<0> in the third slave chip 330a, and the second data transmission/reception unit 332_2b may be selectively enabled based on the second control signal S.ID<1> in the fourth slave chip 330b.

To sum up, the multi-chip package may be formed of multiple-channels (four channels) and transmit/receive the first data DAT<0> through different channels in the master chip 310 and each of the four slave chips 320a, 320b, 330a and 330b. When the multi-chip package transmits/receives the first data DAT<0>, the number of data transmission/reception circuits in each of the slave chips 320a, 320b, 330a and 330b decreases by half, and the data transmission/reception blocks 322a, 322b, 332a and 332b of the first and second slave chips 320a and 320b and the third and fourth slave chips 330a and 330b are stacked and rotated 180 degrees in a horizontal direction with respect to each other. In other words, the first slave region 320 including the first and second slave chips 320a and 320b and the second slave region 330 including the third and fourth slave chips 330a and 330b may be stacked and rotated 180 degrees from each other, in a horizontal direction. Therefore, the loading of signal lines, which occurs when the data transmission/reception operation is performed in multiple-channels, may decrease, and the circuit area occupied by the data transmission/reception circuits may decrease by reducing the number of the data transmission/reception circuits so that the power consumption may also decrease.

Figure 4:
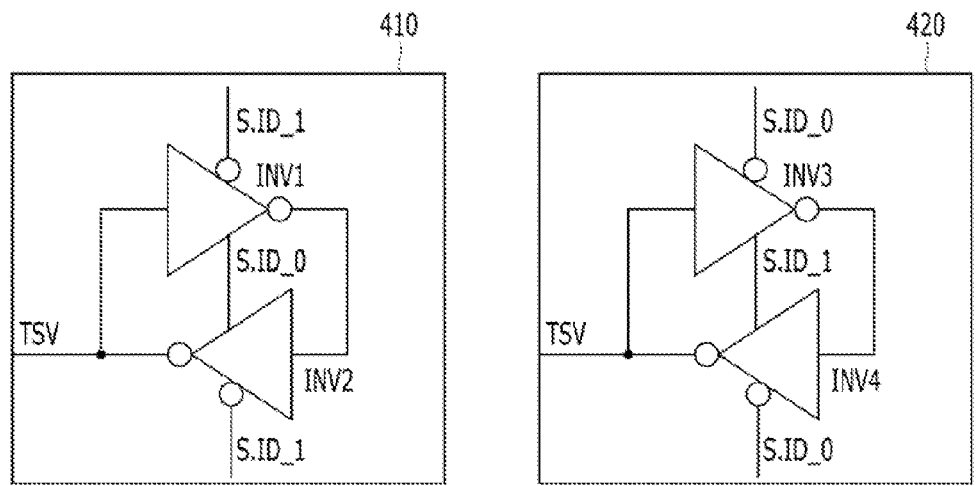
FIG. 4 is a detailed diagram illustrating a data transmission/reception block shown in FIG. 3.

FIG. 4 is a detailed diagram illustrating a data transmission/reception block shown in FIG. 3.

Referring to FIGS. 3 and 4, the data transmission/reception block may include a first data transmission/reception unit 410 and a second data transmission/reception unit 420.

The first data transmission/reception unit 410 may be the first data transmission/reception units 322_1a, 322_1b, 332_1a and 332_1b included in the first to fourth slave chips 320a, 320b, 330a and 330b, respectively, shown in FIG. 3, and the second data transmission/reception unit 420 may be the second data transmission/reception units 322_2a, 322_2b, 332_2a and 332_2b included in the first to fourth slave chips 320a, 320b, 330a and 330b, respectively, shown in FIG. 3.

The first data transmission/reception unit 410 may be formed of a latch circuit including two 3-state inverters INV1 and INV2. The second data transmission/reception unit 420 may be formed of a latch circuit including two 3-state inverters INV3 and INV4. The first and second data transmission/reception units 410 and 420 may operate based on the control signals S.ID<0:1> generated from the control signal generation blocks 321a, 321b, 331a and 331b included in the first to fourth slave chips 320a, 320b, 330a and 330b, respectively, shown in FIG. 3. The first data transmission/reception unit 410 may operate when the first control signal S.ID<0> among the control signal S.ID<0:1> is activated, and the second data transmission/reception unit 420 may operate when the second control signal S.ID<1> is activated. Since the first and second control signals S.ID<0> and S.ID<1> always have complementary values, one between the first data transmission/reception unit 410 and the second data transmission/reception unit 420 may selectively operate.

Figure 5:
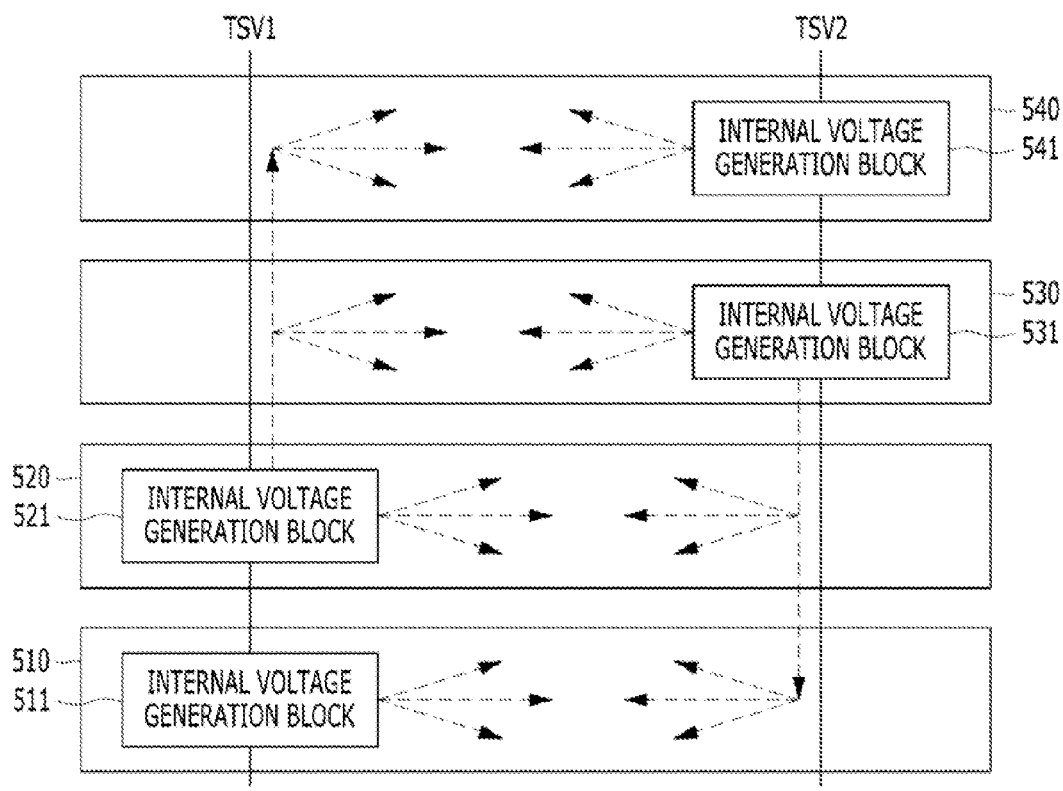
FIG. 5 is a block diagram illustrating a multi-chip package in accordance with an embodiment of the present invention.

FIG. 5 is a block diagram illustrating a multi-chip package in accordance with an embodiment of the present invention.

Referring to FIG. 5, the multi-chip package may include a plurality of semiconductor chips 510, 520, 530 and 540 that are stacked on one another. The semiconductor chips 510, 520, 530 and 540 may include internal voltage generation blocks 511, 521, 531 and 541 for generating an internal voltage (not shown) for internal operations. This is in addition to an external voltage (not shown) inputted from an external device. The semiconductor chips 510, 520, 530 and 540 are coupled with first and second through silicon vias TSV1 and TSV2.

The first through silicon via TSV1 may supply the internal voltage generated from the internal voltage generation blocks 511 and 521 included in the first and second semiconductor chips 510 and 520 among the semiconductor chips 510, 520, 530 and 540 to the third and fourth semiconductor chips 530 and 540, and the second through silicon via TSV2 may supply the internal voltage generated from the internal voltage generation blocks 531 and 541 included in the third and fourth semiconductor chips 530 and 540 to the first and second semiconductor chips 510 and 520.

The internal voltage generation block for generating the internal voltage is typically designed to be disposed on the edge of each semiconductor chip, and so concerns such as voltage drop, etc. occur due to extended lines. For this reason, it may take a long time to transmit a desired voltage from the position of the internal voltage generation block to the other side. Therefore, the occupied circuit area may increase by disposing the internal voltage generation block both sides or designing the occupied circuit area of the internal voltage generation block to be large.

To resolve such concerns, when the semiconductor chips 510, 520, 530 and 540 are stacked on one another, as shown in FIG. 5, the third and fourth semiconductor chips 530 and 540 among the semiconductor chips 510, 520, 530 and 540 may be stacked and rotated 180 degrees in a horizontal direction with respect to the first and second semiconductor chips 510 and 520. In other words, when the first to fourth semiconductor chips 510, 520, 530 and 540 are stacked on one another, the internal voltage generation blocks 511 and 521 included in the first and second semiconductor chips 510 and 520 and the internal voltage generation blocks 531 and 541 included in the third and fourth semiconductor chips 530 and 540 may be stacked and disposed on opposite sides without overlapping with each other.

As described above, although the internal voltage generation blocks 511, 521, 531 and 541 are disposed on the edge of each semiconductor chip, it is possible to receive a power source from the internal voltage generation block disposed on another stacked chip through the first and second through silicon vias TSV1 and TSV2 since the semiconductor chips 510, 520, 530 and 540 are stacked on one another. Therefore, the occupied circuit area for generating the internal voltage may decrease, and the voltage drop may not occur.

In accordance with the embodiments of the present invention, the semiconductor memory may decrease loading (or delay) of data transmission/reception lines by reducing the number of data transmission/reception circuits included in each of the semiconductor chips and stacking the chips in opposite directions (rotated 180 degrees in a horizontal direction with respect to neighboring semiconductor chips). Power consumption may also be reduced by decreasing the chip area occupied by the data transmission/reception circuits.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. A multi-chip package, comprising:
    a master chip including transmission/reception circuits suitable for transmitting/receiving a predetermined data;
    a first slave region that includes data transmission/reception blocks suitable for transmitting/receiving data to/from the master chip through first chip vias and is vertically stacked over the master chip; and a second slave region that includes data transmission/reception blocks suitable for transmitting/receiving the predetermined data to/from the master through second chip vias and is vertically stacked over the first slave region, wherein the data transmission/reception blocks of the first slave region and the first chip vias are arranged over a first portion of the master chip, and the data transmission/reception blocks of the second slave region and the second chip vias are arranged over a second portion of the master chip, which is opposite to the first portion.

2. The multi-chip package of claim 1, wherein the first slave region includes:
a first slave chip stacked over the master chip; and
a second slave chip stacked over the first slave chip.

3. The multi-chip package of claim 2, wherein the second slave region includes:
a third slave chip stacked over the second slave chip; and
a fourth slave chip stacked over the third slave chip.

4. The multi-chip package of claim 3, wherein each of the first to fourth slave chips includes:
first and second data transmission/reception blocks suitable for transmitting/receiving the predetermined data to/from the master chip; and
a control signal generation block suitable for controlling enabling of the first and second data transmission/reception blocks based on a power source received from the master chip.

5. The multi-chip package of claim 4, wherein the control signal generation block generates:
a first control signal for enabling of the first data transmission/reception block; and
a second control signal for enabling of the second data transmission/reception block.

6. The multi-chip package of claim 5, wherein the first and second control signals have complementary logic levels.

7. The multi-chip package of claim 6, wherein the control signal generation block controls the first and second data transmission/reception blocks to be selectively enabled.

8. The multi-chip package of claim 5, wherein the first and second control signals have a value corresponding to a chip identification of a selected slave chip among the slave chips.

9. A multi-chip package, comprising:
a master chip;
first to fourth slave chips sequentially and vertically stacked over the master chip; and
through chip vias for transmitting a predetermined signal between the master chip and the first to fourth slave chips,
wherein each of the first to fourth slave chips includes a signal transmission circuit block for exchanging the predetermined signal with the master chip through one of the through chip vias,
wherein the signal transmission circuit blocks coupled to the same through chip via are disposed to overlap with each other, and the signal transmission circuit blocks coupled to different through chip vias are disposed not to overlap with each other, and
wherein the signal transmission circuit blocks of the first and second slave chips and the through chip vias coupled thereto are arranged over a first portion of the master chip, and the signal transmission circuit blocks of the third and fourth slave chips and the through chip vias coupled thereto are arranged over a second portion of the master chip, which is opposite to the first portion.

10. The multi-chip package of claim 9, wherein each of the first to fourth slave chips further includes a control signal generation block suitable for controlling the corresponding signal transmission circuit block.

11. The multi-chip package of claim 10, wherein the signal transmission circuit block includes signal transmission circuits corresponding to the through chip vias, and the control signal generation block generates control signals corresponding to the number of the signal transmission circuit blocks.

12. The multi-chip package of claim 11, wherein the signal transmission circuit blocks are selectively enabled based on the control signals.

13. The multi-chip package of claim 12, wherein the control signals have a value corresponding to a chip identification of a selected slave chip among the first to fourth slave chips.

14. The multi-chip package of claim 1, wherein the data transmission/reception blocks of the first slave region and the data transmission/reception blocks of the second slave region are disposed not to be overlapped.

* * * * *